United States Patent [19]

Matsuda et al.

[11] Patent Number: 4,917,939
[45] Date of Patent: Apr. 17, 1990

[54] RECORDING METHOD AND RECORDING MEDIUM

[75] Inventors: Hiroshi Matsuda, Yokohama; Kenji Saito; Kunihiro Sakai, both of Tokyo; Ken Eguchi, Yokohama; Yukuo Nishimura, Sagamihara; Takashi Nakagiri, Tokyo, all of Japan

[73] Assignee: Canon Kabushiki Kaisha, Japan

[21] Appl. No.: 851,083

[22] Filed: Apr. 14, 1986

[30] Foreign Application Priority Data

Apr. 16, 1985 [JP] Japan .................................. 60-80853
Apr. 16, 1985 [JP] Japan .................................. 60-80854

[51] Int. Cl.$^4$ .......................... B32B 9/04; G01D 9/00
[52] U.S. Cl. .................................. 428/216; 428/411.1; 428/913; 427/164; 427/402; 427/407.1; 346/135.1; 369/284
[58] Field of Search ...................... 428/216, 411.1, 913

[56] References Cited

U.S. PATENT DOCUMENTS

| | | | |
|---|---|---|---|
| 4,215,208 | 7/1980 | Yee et al. | 526/285 |
| 4,439,514 | 3/1984 | Garito | 430/272 |
| 4,536,450 | 8/1985 | Garito | 428/411.1 |
| 4,583,102 | 4/1986 | Tamura et al. | 427/402 |

Primary Examiner—P. C. Ives

[57] ABSTRACT

A recording method is provided which comprises irradiating a recording medium having a recording layer containing a diacetylene derivative compound with a laser beam having a wavelength of 420 to 800 nm according to an input information to allow irradiated portions of the recording medium to cause a color change and thereby to conduct recording. A recording medium for the recording method is also provided.

8 Claims, 2 Drawing Sheets

RECORDING METHOD AND RECORDING MEDIUM

BACKGROUND OF THE INVENTION

1. Field of the Invention

This invention relates to a recording method which utilizes chemical or physical changes of a diacetylene derivative compound to conduct recording, as well as to a recording medium used in said recording method.

2. Related Background Art

Various recording media using an organic compound as a recording layer have conventionally been known.

For example, optical recording media employing an organic compound in the form of a thin film as a recording layer are disclosed, for example, in Japanese Patent Laid-Open Publication Nos. 16948/1981 and 125246/1983. Each of these publications discloses a laser recording medium which uses an organic dye as a recording layer and can conduct recording and reproduction using a laser beam. The recording medium disclosed in Japanese Patent Laid-Open No. 125246/1983, in particular, uses as a recording layer a thin film of a cyanine dye represented by the following general formula (I).

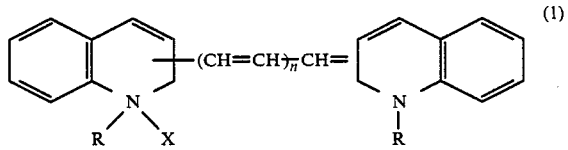

A solution of a cyanine dye represented by the formula (I) is coated on a plastic substrate in thickness of 1,000 Å or below (e.g. 300 Å) using a rotary coater or the like, to form a thin film. In this case, if the distribution and orientation of the dye molecules in the film are at random, light will be scattered in the film on irradiation of the film, and thus a chemical reaction degree varies microscopically at each light exposure. Hence, the molecules in the film are desired to have uniform distribution and uniform orientation, and further the film is required to be made as thin as possible to obtain high density recording. However, the film thickness has been limited to about 300 Å when the film is prepared according to a coating method and further in this method, the random distribution and random orientation of molecules in the film have been unavoidable.

It is known that films formed by coating a solution of a diacetylene derivative compound on a carrier and drying the solution have the following properties.

(1) Such a film is colorless in the original state but, when exposed to ultraviolet rays to cause a certain degree of polymerization, is changed to a first state giving a blue color. This first state of blue color can not be returned to the colorless original state even after the exposure to ultraviolet rays is stopped. Therefore, the change from the original state to the first state due to exposure to ultraviolet rays is irreversible.

(2) The film in the first state, when heated to about 50° C. by applying a thermal energy, is changed to a second state of red color. This second state can not be returned to the first state of blue color even after the heating is stopped and the film is cooled. Therefore, the change from the first state to the second state due to a heat is also irreversible.

(3) The film in the second state, when heated to about 300° C. by applying a thermal energy, is changed to a third state of yellow color. This third state can be returned to the second state when the heating is stopped and the film is cooled. Therefore, the change between the second state and the third state is reversible.

Thus it is known that a colorless and transparent film made from a diacetylene derivative compound, when exposed to ultraviolet rays, causes a polymerization reaction and turns blue.

This color development reaction has been considered to be caused only by ultraviolet rays or gamma-ray and not by a light of relatively high wavelength. [G. Wegner, "Chemistry and Physics of One-Dimensional Metals", Plenum (1977), p. 297]

Further, the film made from a diacetylene derivative compound has a drawback that the film, when allowed to stand indoors, is affected by an outdoor light, particularly, ultraviolet rays to cause deterioration with time resulting poor storability.

SUMMARY OF THE INVENTION

As a result of extensive study, the present inventors found that a colorless and transparent film made from a diacetylene derivative compound undergoes polymerization by laser beam irradiation and turns blue. This finding has led to the completion of the present invention.

An object of the present invention is to provide a recording method which can conduct recording in high density and with high resolution using a light of relatively broad wavelength range.

Another object of the present invention is to provide a recording medium excellent in record stability and easy handling of the medium.

According to an aspect of the present invention, there is provided a recording method which comprises irradiating a recording medium having a recording layer containing a diacetylene derivative compound with a laser beam having a wavelength of 420 to 800 nm according to an input information to allow irradiated portions of the recording medium to cause a color change and thereby to conduct recording.

According to another aspect of the present invention, there is provided a recording medium comprising a recording layer containing a diacetylene derivative compound and an ultraviolet absorption layer.

DETAILED DESCRIPTION OF THE PREFERRED EMBODIMENTS

The substance constituting the recording layer of the recording medium of the present invention has at least one hydrophilic site, at least one hydrophobic site and at least one diacetylene site in the molecule and is hereinafter referred to as a diacetylene derivative compound.

The diacetylene derivative compound is represented by the following general formula

$$R_1-C\equiv C-C\equiv C-(R_2)_n-X$$

wherein X is a hydrophilic site, $R_1$ and $R_2$ are each a hydrophobic site, $C\equiv C-C\equiv C$ is a diacetylene site and n is 0 or 1. Examples of the hydrophilic site are polar groups such as hydroxyl group, carboxyl group, amino group, nitrile group, thioalcohol group, imino group, sulfone group and their derivatives as well as their salts. The hydrophobic site $R_1$ is preferably a long chain alkyl or alkenyl group and $R_2$ a long chain alkylene or alkenylene group, the total of the carbon atoms of $R_1$ and $R_2$ being preferably 10–30.

The monomolecular or built-up film of a diacetylene derivative compound can be produced by using, for example, the Langmuir-Blodgett method (hereinafter referred to as the LB method) developed by I. Langmuir and others. In the LB method, a monomolecular or built-up film is produced by utilizing a phenomenon that, for example, a molecule having both a hydrophilic site and a hydrophobic site forms a monomolecular layer on a water surface with the hydrophilic site facing water if the hydrophilicity and the hydrophobicity are well-balanced. A monomolecular layer on the water surface has a characteristics of a two-dimensional system. When molecules are present on water sparsely, the formula of the two-dimensional ideal gas is valid between the area per molecule and the surface pressure $\pi$, and each molecule forms a "gas film".

$$\pi A = kT$$

k: Boltzmann's constant
T: Absolute temperature

When A is made sufficiently small, the interaction between molecules becomes stronger and the gas film is converted to a "condensed film (or solid film)" of a two-dimensional solid. This condensed film can be transferred one by one onto the surface of a carrier having a desired property and shape such as a glass substrate. Specific production of a monomolecular or built-up film of the diacetylene derivative compound of the present invention according to the LB method can be conducted, for example, as follows.

Figure 2A:
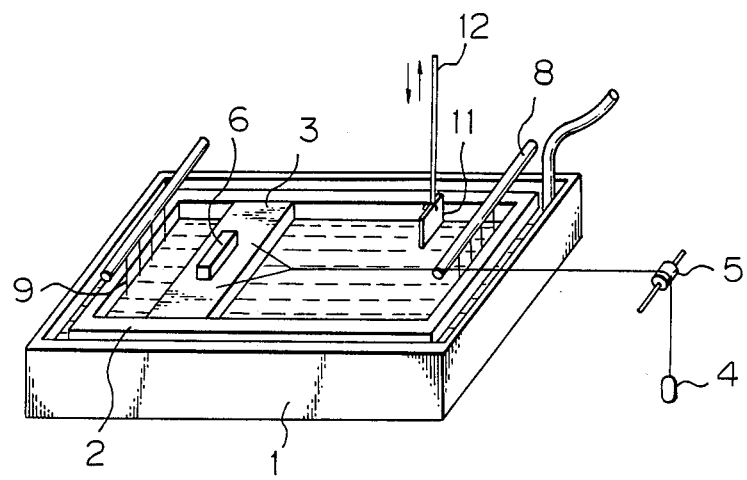
FIGS. 2A and 2B are schematic drawings of an apparatus for producing a recording medium of the present invention.
Figure 2B:
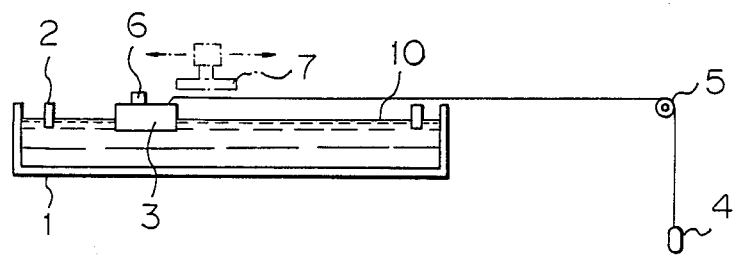

A desired diacetylene derivative compound is dissolved in a solvent such as chloroform. Then, using an apparatus shown in FIGS. 2A and 2B, the diacetylene derivative compound solution is spread on a water surface 10 to form a diacetylene derivative compound film thereon.

Subsequently, in order to prevent too wide spreading of the diacetylene derivative compound film on the water phase, a partitioning plate (or a float) 3 is provided to restrict the spreading area of the film and to control the gathering state of the film-forming substance, whereby the film can have a surface pressure $\pi$ proportional to the gathering state. This partitioning plate 3 is moved to restrict the spreading area of the film, to control the gathering state of the film substance and to gradually increase the surface pressure of the film, whereby the film is made to have a surface pressure $\pi$ suitable for the production of a built-up film. While keeping this surface pressure, a clean carrier 11 is moved vertically (downward and upward) gently, whereby a monomolecular film of the diacetylene derivative compound (hereinafter referred to as a diacetylene monomolecular film) is transferred onto the carrier 11. Thus a diacetylene monomolecular film is produced. A built-up film of the diacetylene derivative compound consisting of a desired number of monomolecular layers can be obtained by repeating the above procedure. For transfer of a diacetylene monomolecular film onto a carrier, various methods such as a horizontal lifting method, a rotary cylinder method and the like can be used in addition to said vertical dipping method. In the horizontal lifting method, a carrier is allowed to horizontally contact with the surface of water and thereby a monomolecular film on the water is transferred onto the carrier. In the rotary cylinder method, a cylindrical carrier is rotated on the surface of water and thereby a monomolecular film on the water is transferred onto the carrier surface. In the vertical dipping method, when a carrier having a hydrophilic surface is pulled up from water in a direction transversing the water surface, a diacetylene monomolecular film is formed on the carrier with the hydrophilic group of the diacetylene derivative compound directed toward the carrier. By moving the carrier downward and upward, one diacetylene monomolecular layer can be produced by one movement stage. In the pulling-up stage and the dipping stage there are produce monomolecular layers of opposite molecule directions; as a result, between the two adjacent layers, the hydrophilic group and the hydrophobic group both of the diacetylene derivative compound face each other; accordingly, a built-up film of Y type is formed.

Meanwhile, in the horizontal lifting method, a diacetylene monomolecular film is formed on a carrier with the hydrophobic group directed toward the carrier. In the built-up film according to this method, therefore, each monomolecular layer is directed toward one same direction, that is, all the hydrophobic groups are directed toward the carrier and accordingly a built-up film of X type is formed. Conversely, a built-up film wherein all the hydrophilic groups of all monomolecular layers are directed toward a carrier is called a Z type film.

The methods for transfer of a diacetylene monomolecular layer onto a carrier are not restricted to those mentioned above. For instance, when a carrier of large area is required, there can be used a method wherein a carrier is extruded from a carrier roll into a water phase. The above mentioned directions of the hydrophilic group and the hydrophobic group of diacetylene derivative compound toward a carrier are mentioned on a basis of a general principle and can be changed as necessary, for example, by treating the surface of the carrier.

The diacetylene monomolecular or built-up film as a recording layer preferably has a thickness of 50 Å to 2 $\mu$m, more preferably of 100 to 5,000 Å.

Figure 1A:
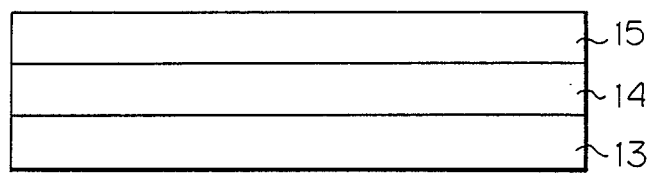
FIGS. 1A, 1B and 1C are schematic drawings for explaining the recording medium and the recording method of the present invention.

On the diacetylene monomolecular or built-up film formed as above, there is formed an ultraviolet absorption layer, whereby a recording medium of the present invention is obtained (FIG. 1). This ultraviolet absorption layer must be able to absorb at least weak ultraviolet rays such as contained in an indoor light. Therefore, various polymers can be considered as materials for such an ultraviolet absorption layer; however, polymers having aromatic rings within the molecule are preferable because of their high absorbability for ultraviolet rays. Examples of these preferable polymers are polystyrenes, phenol resins, xylene resins, epoxy resins (composed essentially of bisphenol, diphenol acid, a novolac resin, cashew phenol, tetraoxytetraphynylethane or the like), polycarbonates and thermoplastic polyesters. Of the thermoplastic polyesters, a polyethylene terephthalate having a trade name of "Mylar" is particularly preferable because of its complete interception of rays of 315 nm or shorter wavelength.

These polymers are coated on the diacetylene monomolecular or built-up film according to a rotary coating method, a roller method or the like.

The ultraviolet absorption layer preferably has a thickness of 200 Å to 2 μm, more preferably of 400 to 5,000 Å.

The diacetylene monomolecular or built-up film thus formed on a carrier has a high density and high orderliness. By constituting a recording layer with this film, a recording medium can be obtained which enables recording (e.g. optical recording, thermal recording) of high density and high resolution in accordance with the function of a diacetylene derivative compound used.

A method for recording an information on the recording medium formed above will be described below.

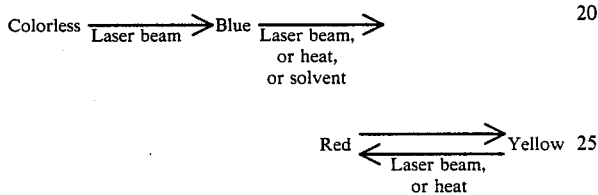

A colorless and transparent film is irradiated according to an input information with a laser beam having a wavelength of 420 to 800 nm, whereby the film turns blue. The blue film shows its maximum absorption at a wavelength of 620 to 660 nm. This change is caused by a laser beam and not by heat or a solvent. This is presumably due to the fact that the diacetylene built-up film generates a second harmonic. The blue film never returns to the original colorless and transparent film.

Then, the blue film is irradiated with a laser beam, or heated to about 60° C., or treated with a solvent such as acetone, ethanol or the like, whereby the film turns red with its maximum absorption of about 540 nm. This change is also irreversible.

Then, the red film is irradiated with a laser beam or heated to about 300° C., whereby the film turns yellow with its maximum absorption of about 450 nm. This yellow film returns to the red film at room temperature.

The present invention will be explained in more detail below by way of Examples

EXAMPLE 1

A diacetylene derivative compound represented by the formula (2) was dissolved in chloroform in a concentration of $2.5 \times 10^3$ mol/l.

$$C_{11}H_{23}C\equiv C-C\equiv C-(CH_2)_8-COOH \quad (2)$$

The resulting solution was spread on a water phase 10 (FIG. 2B) of pH 6.9 containing $1 \times 10^{-3}$ mol/l of cadmium chloride. After chloroform in the solution spread had vaporized, the surface pressure of the film of the diacetylene derivative compound was increased up to 20 dyne/cm. While keeping the surface pressure constant, a carrier (a Mylar plate having a sufficiently clean and hydrophilic surface) was moved vertically (downward and upward) gently at a speed of 1.0 cm/min so as to transverse the water surface, whereby the diacetylene monomolecular film was transferred onto the carrier 11 (FIG. 2A) and thus a diacetylene monomolecular film and built-up films 14 each consisting of 6, 20, 40 or 60 dicetylene monomolecular layers (FIG. 1A) were formed.

On these recording layers was coated a polyethylene terephthalate in a thickness of 1,000 Å to form an ultraviolet absorption layer 15 (FIG. 1A), whereby recording media were produced.

Figure 1B:
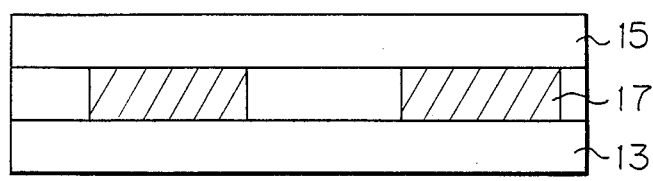
Figure 1C:
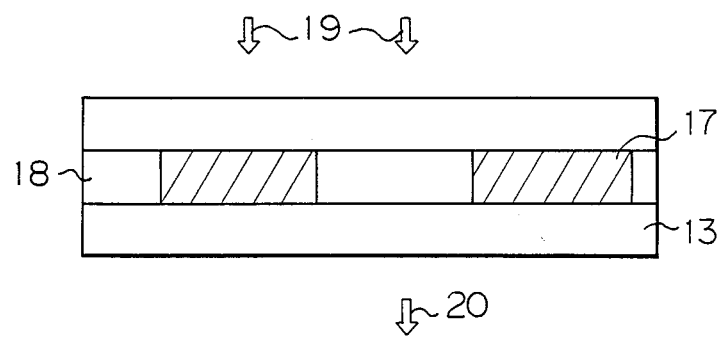

Each of these recording media (FIG. 1A) was irradiated with a He-Cd laser beam 16 of 8 mW output and 442 nm wavelength according to a certain pattern in an indoor light or in a dark place, whereby each recording medium was allowed to turn blue and an information was recorded thereon (FIG. 1B). The spot diameter of the laser beam was 0.5 μm and the irradiation time was 1 to 2 msec.

Reproduction of the recorded information was conducted by scanning a He-Ne laser beam 19 of 1 mW output and 633 nm wavelength on each recording medium (FIG. 1C) and detecting the transmitted light 20 using a light-receiving element (not shown).

The laser beam of 633 nm wavelength transmitted through the non-irradiated transparent portions 18 without being substantially absorbed. The transmittance was 70% or above.

The irradiated portions 17 absorbed the laser beam of 633 nm wavelength. The more the number of monomolecular layers, the higher was the absorption.

Since the non-irradiated portions and the irradiated portions exhibit a striking contrast, a reproduction signal of high S/N ratio could be obtained. Repeated reading-out confirmed good reproducibility.

Each recording medium was allowed to stand for one month or longer in a light place. However, no change was observed and moreover, for the medium after the standing, information recording and reproduction by a laser beam was possible

EXAMPLE 2

Recording media were produced in the same manner as in Example 1 except that a diacetylene derivative compound represented by the formula (3) was used.

$$C_9H_{19}C\equiv C-C\equiv C-(CH_2)_{10}COOH \quad (3)$$

Using these recording media, recording and reproduction were conducted in the same manner as in Example 1. Nearly the same results as in Example 1 were obtained.

EXAMPLE 3

Recording media were produced in the same manner as in Example 1 except that a diacetylene derivative compound represented by the formula (4) was used.

$$C_{18}H_{37}C\equiv C-C\equiv C-(CH_2)_5COOH \quad (4)$$

Using these recording media, recording and reproduction were conducted in the same manner as in Example 1. Nearly the same results were obtained.

EXAMPLE 4

Recording and reproduction were conducted in the same manner as in Example 1 except that the He-Cd laser beam used in Example 1 was replaced by an argon laser (output: 7 mW, wavelength: 488 nm, spot diameter: 0.5 μm, irradiation time: 1 to 2 msec). Nearly the same results as in Example 1 were obtained

EXAMPLE 5

Recording and reproduction were conducted in the same manner as in Example 1 except that the He-Cd laser beam used in Example 1 was replaced by a He-Ne laser beam (output: 8 mW, wavelength: 633 nm; spot diameter: 1 μm, irradiation time: 1 to 2 msec). Nearly the same results as in Example 1 were obtained.

EXAMPLE 6

Recording and reproduction were conducted in the same manner as in Example 1 except that the He-Cd laser beam used in Example 1 was replaced by a dye laser beam (OXAZINEI, output: 10 mW, wavelength: 750 nm, spot diameter: 1 μm, irradiation time: 50 msec). Nearly the same results as in Example 1 were obtained.

The meritorious effects of the present invention will be summarized below.

(1) Laser beam recording is feasible which enables recording with high density and high resolution.

(2) As compared with conventionally used light beams, a light of wavelength range of longer wavelength can be used.

(3) The high density and high orderliness of the recording layer enables high density recording.

(4) A larger difference of transmittance gives an improved S/N ratio.

(5) The recording layer is uniform even when it is formed on a carrier of large area.

(6) With an ultraviolet absorption layer, the recording medium is very stable under indoor light, has a high mechanical strength, and accordingly is easy to handle.

We claim:

1. A recording medium comprising a recording layer containing a diacetylene derivative compound and an ultraviolet radiation absorption layer capable of absorbing sufficient ultraviolet radiation causing color change in the recording layer to provide enhanced storage stability for said recording medium, said recording layer being capable of changing color at a portion irradiated with a beam having a wavelength of 420 nm to 800 nm in accordance with input information to effect recording.

2. A recording medium according to claim 1, wherein the diacetylene derivative compound is represented by the following formula

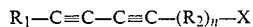

$$R_1-C\equiv C-C\equiv C-(R_2)_n-X$$

wherein $R_1$ and $R_2$ are each a hydrophobic site, X is a hydrophilic site and n is 0 or 1.

3. A recording medium according to claim 1, wherein the recording layer comprises a monomolecular or built-up film of the diacetylene derivative compound.

4. A recording medium according to claim 1, wherein the recording layer comprises a Langmuir-Blodgett film of the diacetylene derivative compound.

5. A recording medium according to claim 1, wherein the recording layer has a thickness of 50 Å to 2 μm.

6. A recording medium according to claim 1, wherein the ultraviolet absorption layer has a thickness of 200 Å to 2 μm.

7. A recording medium according to claim 1, wherein the recording layer has a thickness from 100 Å to 5000 Å.

8. A recording medium according to claim 1, wherein the ultraviolet radiation absorption layer has a thickness from 400 Å to 5000 Å.

* * * * *